United States Patent
Bai et al.

(10) Patent No.: US 9,296,915 B1
(45) Date of Patent: Mar. 29, 2016

(54) TOUGHENED ARYLCYCLOBUTENE POLYMERS

(71) Applicants: Dow Global Technologies LLC, Midland, MI (US); Rohm and Haas Electronic Materials LLC, Marlborough, MA (US)

(72) Inventors: Zhifeng Bai, Midland, MI (US); Michael K. Gallagher, Hopkinton, MA (US); Zidong Wang, Southborough, MA (US); Christopher J. Tucker, Midland, MI (US); Matthew T. Bishop, Midland, MI (US); Elissei Lagodkine, Marlborough, MA (US); Mark S. Oliver, Charlestown, MA (US)

(73) Assignees: Dow Global Technologies LLC, Midland, MI (US); Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 14/684,187

(22) Filed: Apr. 10, 2015

(51) Int. Cl.
| | | |
|---|---|---|
| *C09D 143/04* | (2006.01) | |
| *C08L 51/08* | (2006.01) | |
| *C08L 63/00* | (2006.01) | |
| *C08L 27/06* | (2006.01) | |
| *B05D 3/10* | (2006.01) | |
| C08L 25/16 | (2006.01) | |
| C08L 25/10 | (2006.01) | |
| C08L 51/04 | (2006.01) | |
| C08L 51/06 | (2006.01) | |

(52) U.S. Cl.
CPC ............... *C09D 143/04* (2013.01); *B05D 3/10* (2013.01); *C08L 27/06* (2013.01); *C08L 51/08* (2013.01); *C08L 63/00* (2013.01); C08L 25/10 (2013.01); C08L 25/16 (2013.01); C08L 51/04 (2013.01); C08L 51/06 (2013.01)

(58) Field of Classification Search
CPC ......... C08L 51/04; C08L 51/06; C08L 51/08; C08L 27/06; C08L 25/10; C08L 25/16; C08L 63/00; B05D 3/10
See application file for complete search history.

(56) References Cited

U.S. PATENT DOCUMENTS

| | | | |
|---|---|---|---|
| 6,670,101 | B2 | 12/2003 | Ohba et al. |
| 7,109,249 | B2 | 9/2006 | Bruza et al. |
| 7,164,197 | B2 * | 1/2007 | Mao et al. ...................... 257/700 |
| 8,927,677 | B2 * | 1/2015 | Karunakaran et al. ......... 528/112 |
| 2008/0171817 | A1 * | 7/2008 | Peters et al. ................... 524/100 |

OTHER PUBLICATIONS

Klemann et al, "The fracture toughness of thin polymeric films", Polymer Engineering & Science, Mid-Jan. 1996, vol. 36, No. 1, pp. 126-134.
Wu, et al, "Structure and properties of PBO-PEO diblock copolymers modified epoxy", Journal of Polymer Science: Party B: Polymer Chemistry, 2005, vol. 43, pp. 1950-1965.
Thio, et al, "Epoxy toughening using low molecular weight poly(hexyleneoxide)-poly(ethylene oxide) diblock copolymers", Macromolecules, 2006, vol. 39, pp. 7187-7189.

* cited by examiner

*Primary Examiner* — Nathan M Nutter
(74) *Attorney, Agent, or Firm* — S. Matthew Caims

(57) ABSTRACT

Arylcyclobutene polymers having improved toughness are provided. Compositions and methods for coating arylcyclobutene polymers having improved toughness are also provided.

13 Claims, No Drawings

TOUGHENED ARYLCYCLOBUTENE POLYMERS

The present invention relates generally to the field of polymer materials, and more particularly to arylcyclobutene-based polymers useful in the manufacture of electronic devices.

Arylcyclobutene-based polymers are used as dielectric materials in a variety of electronic applications, such as microelectronic packaging and interconnect applications. Arylcyclobutene-based polymers possess many desirable properties for these applications. However, these polymers do suffer from certain mechanical limitations, such as low fracture toughness, low elongation and poor tensile strength, which limits the use of these polymers in certain electronic applications.

One approach to improving the mechanical properties of arylcyclobutene-based polymers is disclosed in U.S. Pat. No. 6,420,093. This patent discloses compositions providing benzocyclobutene-based polymers having improved toughness, the compositions comprising a) at least one precursor compound selected from arylcyclobutene monomers, arylcyclobutene oligomers, and combinations thereof; and b) a polymer or oligomer having a backbone comprising ethylenic unsaturation (that is, carbon-carbon double bond(s)) and terminal acrylate or methacrylate groups. The toughening additives disclosed in this patent have a significant amount of carbon-carbon double bonds in the polymer backbone. However, when these compositions are used in certain photopatterning applications, the improved elongation toughness of the benzocyclobutene polymers is lost due to competing reactions involving the carbon-carbon double bonds of the added polymer or oligomer. In addition, residual carbon-carbon double bonds in the added polymer backbone may lead to yellowing of the material over time, which may be detrimental for certain applications. Accordingly, there remains a need for alternative materials that can provide arylcyclobutene-based materials having improved mechanical properties.

U.S. patent application Ser. No. 14/069,348 (Zhifeng Bai et al.), filed Oct. 31, 2013, discloses a process of disposing a layer of a temporary bonding composition comprising a curable adhesive material, a release additive and a compatibilizer, such as polybutyleneoxide homopolymers, between the active (device) side of a semiconductor wafer and the attachment surface of a carrier substrate; followed by curing the adhesive material to provide a temporary bonding layer disposed between the active side of the semiconductor wafer and the attachment surface of the carrier substrate; wherein the temporary bonding layer adjacent to the attachment surface of the carrier substrate comprises a relatively lower amount of the release additive and the temporary bonding layer adjacent to the active side of the semiconductor wafer comprises a relatively higher amount of the release additive. Upon curing of the adhesive material, the release additive phase separates toward the active surface of the semiconductor wafer, enabling low-force mechanical debonding at room temperature. The compatibilizer was added to the composition of U.S. patent application Ser. No. 14/069,348 in order to increase the amount of the release additive that can be dissolved in the composition. Suitable curable adhesive materials disclosed in this patent application include arylcyclobutenes. Suitable release additives are any which phase separate from the adhesive material upon curing of the adhesive material and migrate toward a relatively more hydrophilic surface. Only compositions including release additives are disclosed in this patent application.

The present invention provides a composition comprising: a) a curable material chosen from one or more arylcyclobutene monomers, one or more arylcyclobutene polymers, and mixtures thereof; b) one or more toughening agents comprising as polymerized units —(O—CH$_2$CHR), wherein R is a C$_{2-8}$ hydrocarbyl moiety-; and c) one or more organic solvents; wherein the one or more toughening agents are free of —(OCH$_2$CH(CH$_3$))— as polymerized units, and wherein the compositions are substantially free of release additives. The present invention also provides a composition comprising: a) a curable material chosen from one or more arylcyclobutene monomers, one or more arylcyclobutene polymers, and mixtures thereof; b) one or more toughening agents comprising as polymerized units —(O—CH$_2$CHR)—, wherein R is a C$_{2-8}$ hydrocarbyl moiety; and c) one or more organic solvents; wherein the one or more toughening agents are free of —(OCH$_2$CH(CH$_3$))— as polymerized units, wherein the compositions are substantially free of release additives and substantially free of polybutyleneoxide monododecylphenyl ether. The present toughening agents are polymeric and preferably have a polymer backbone that is free of carbon-carbon double bonds. The present compositions are preferably free of release additives.

The present invention further provides a method comprising: coating on a substrate a layer of a composition comprising: a) a curable material chosen from one or more arylcyclobutene monomers, one or more arylcyclobutene polymers, and mixtures thereof; b) one or more toughening agents comprising as polymerized units —(O—CH$_2$CHR)—, wherein R is a C$_{2-8}$ hydrocarbyl moiety; and c) one or more organic solvents; wherein the one or more toughening agents are free of —(OCH$_2$CH(CH$_3$))— as polymerized units, and wherein the compositions are substantially free of release additives; at least partially removing the one or more organic solvents; and curing the curable material to form a cured polymer coating. Also provided by the present invention is a method comprising: coating on a substrate a layer of a composition comprising: a) a curable material chosen from one or more arylcyclobutene monomers, one or more arylcyclobutene polymers, and mixtures thereof; b) one or more toughening agents comprising as polymerized units —(O—CH$_2$CHR)—, wherein R is a C$_{2-8}$ hydrocarbyl moiety; and c) one or more organic solvents; wherein the one or more toughening agents are free of —(OCH$_2$CH(CH$_3$))— as polymerized units, and wherein the compositions are substantially free of release additives and substantially free of polybutyleneoxide monododecylphenyl ether; at least partially removing the one or more organic solvents; and curing the curable material to form a cured polymer coating.

Also provided by the present invention is a polymer coating comprising: a) a polymer comprising one or more arylcyclobutene monomers as polymerized units; and b) one or more toughening agents comprising as polymerized units —(O—CH$_2$CHR)—, wherein R is a C$_{2-8}$ hydrocarbyl moiety; wherein the one or more toughening agents are free of —(OCH$_2$CH(CH$_3$))— as polymerized units, and wherein the polymer coating is substantially free of release additives. In addition, the present invention provides a polymer coating comprising: a) a polymer comprising one or more arylcyclobutene monomers as polymerized units; and b) one or more toughening agents comprising as polymerized units —(O—CH$_2$CHR)—, wherein R is a C$_{2-8}$ hydrocarbyl moiety; wherein the one or more toughening agents are free of —(OCH$_2$CH(CH$_3$))— as polymerized units, and wherein the polymer coating is substantially free of release additives and substantially free of polybutyleneoxide monododecylphenyl ether.

As used throughout this specification, the following abbreviations shall have the following meanings, unless the context clearly indicates otherwise: ° C.=degree Celsius; g=gram; mg=milligram; L=liter; ppm=part per million; µm=micron=micrometer; nm=nanometer; mm=millimeter; mL=milliliter; kPa=kilopascal; GPa=gigapascal; $M_w$=weight average molecular weight; and $M_n$=number average molecular weight. All amounts are percent by weight and all ratios are molar ratios, unless otherwise noted. All numerical ranges are inclusive and combinable in any order, except where it is clear that such numerical ranges are constrained to add up to 100%. "Wt %" refers to percent by weight, based on the total weight of a referenced composition, unless otherwise noted.

As used throughout the specification, "feature" refers to the geometries on a substrate, and particularly on a semiconductive wafer. The term "alkyl" includes linear, branched and cyclic alkyl. Likewise, "alkenyl" refers to linear, branched and cyclic alkenyl. "Aryl" refers to aromatic carbocycles and aromatic heterocycles. "(Meth)acryloyl" refers to both "acryloyl" and "methacryloyl". By the term "curing" is meant any process, such as polymerization or condensation, that increases the molecular weight of a material or composition. "Curable" refers to any material capable of being cured under certain conditions. The term "polymer" refers to dimers, trimers, tetramers, oligomers, and other relatively low molecular weight materials that are capable of further curing. The articles "a", "an" and "the" refer to the singular and the plural.

Compositions of the invention comprise: a) a curable adhesive material chosen from one or more arylcyclobutene monomers, one or more arylcyclobutene polymers, and mixtures thereof; b) one or more toughening agents comprising as polymerized units —(O—CH$_2$CHR)—, wherein R is a C$_{2-8}$ hydrocarbyl moiety; and c) one or more organic solvents; wherein the one or more toughening agents are free of —(OCH$_2$CH(CH$_3$))— as polymerized units, and wherein the composition is substantially free of release additives. As used herein, the term "arylcyclobutene polymers" refers to polymers comprising one or more arylcyclobutene monomers as polymerized units. Also as used herein, the term "release additives" has the meaning described in U.S. patent application Ser. No. 14/069,348 (Zhifeng Bai et al.), filed Oct. 31, 2013. A release additive is a material that, when added to the curable material, phase separates from the curable adhesive material during curing and migrates toward a surface of the curing adhesive material, forming a visually detectable phase separated film. Release additives are preferentially more hydrophilic than the cured adhesive material. Such release additives possess appropriate hydrophilic moieties that allow for complete dispersion or dissolution of the release additive in the uncured adhesive material composition, and allow for phase separation of the release additive during curing of the adhesive material with migration of the release additive out of the curing adhesive material and toward a more hydrophilic surface. "Substantially free of release additives" means the present compositions contain <1 wt % of release additives, such as from 0 to <1 wt %, preferably from 0 to 0.5 wt %, and more preferably from 0 to 0.25 wt % of release additives. It is more preferred that the present compositions are free of release additives.

Arylcyclobutene polymers useful as the present curable adhesive materials are well-known in the art. Suitable arylcyclobutene polymers include, but are not limited to, those having the formula:

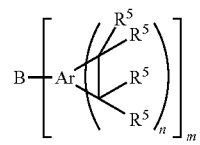

wherein B is an n-valent linking group; Ar is a polyvalent aryl group and the carbon atoms of the cyclobutene ring are bonded to adjacent carbon atoms on the same aromatic ring of Ar; m is an integer of 1 or more; n is an integer of 1 or more; and R$^5$ is a monovalent group. Preferably, the polyvalent aryl group, Ar, may be composed of 1 to 3 aromatic carbocyclic or heteroaromatic rings. It is preferred that the aryl group comprise a single aromatic ring, and more preferably a phenyl ring. The aryl group is optionally substituted with 1 to 3 groups chosen from C$_{1-6}$ alkyl, tri-C$_{1-6}$-alkylsilyl, C$_{1-6}$ alkoxy, and halo, preferably with one or more of C$_{1-6}$ alkyl, tri-C$_{1-3}$-alkylsilyl, C$_{1-3}$ alkoxy, and chloro, and more preferably with one or more of C$_{1-3}$ alkyl, tri-C$_{1-3}$-alkylsilyl, and C$_{1-3}$ alkoxy. It is preferred that the aryl group is unsubstituted. It is preferred that n=1 or 2, and more preferably n=1. It is preferred that m=1-4, more preferably m=2-4, and yet more preferably m=2. Preferably, R$^5$ is chosen from H, C$_{1-6}$ alkyl, C$_{1-6}$ alkenyl, C$_{1-6}$ alkoxy, carboxy, C$_{2-6}$ carboxy-containing moiety, C$_{2-6}$ keto-containing moiety, C$_{1-6}$ amido-containing moiety, C$_{2-6}$ alkoxyalkanol, and C$_{2-6}$ alkoxyester, and more preferably from H, C$_{1-3}$ alkyl, and C$_{1-3}$ alkoxy. Preferably, B comprises one or more carbon-carbon double bonds (ethylenic unsaturation). Suitable single valent B groups preferably have the formula —[C(R$^{10}$)=CR$^{11}$]$_x$Z, wherein R$^{10}$ and R$^{11}$ are independently chosen from hydrogen, C$_{1-6}$ alkyl, and aryl; Z is chosen from hydrogen, C$_{1-6}$ alkyl, aryl, siloxanyl, —CO$_2$R$^{12}$; each R$^{12}$ is independently chosen from H, C$_{1-6}$ alkyl, aryl, aralkyl, and alkaryl; and x=1 or 2. Preferably, R$^{10}$ and R$^{11}$ are independently chosen from H, C$_{1-3}$ alkyl, and aryl, and more preferably H and C$_{1-3}$ alkyl. It is preferred that R$^{12}$ is C$_{1-3}$ alkyl, aryl, and aralkyl. Z is preferably siloxyl. Preferred siloxyl groups have the formula —[Si(R$^{13}$)$_2$—O] p-Si(R$^{13}$)$_2$—, wherein each R$^{13}$ is independently chosen from H, C$_{1-6}$ alkyl, aryl, aralkyl, and alkaryl; and p is an integer from 1 or more. It is preferred that R$^{13}$ is chosen from C$_{1-3}$ alkyl, aryl, and aralkyl. Suitable aralkyl groups include benzyl, phenethyl and phenylpropyl.

Preferably, the arylcyclobutene polymers comprise one or more oligomers of the formula:

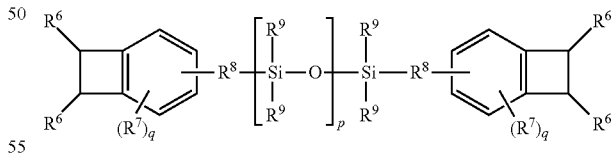

wherein each R$^6$ is independently chosen from H, C$_{1-6}$ alkyl, C$_{1-6}$ alkenyl, C$_{1-6}$ alkoxy, carboxy, C$_{2-6}$ carboxy-containing moiety, C$_{2-6}$ keto-containing moiety, C$_{1-6}$ amido-containing moiety, C$_{2-6}$ alkoxyalkanol, and C$_{2-6}$ alkoxyester, and preferably from H, C$_{1-3}$ alkyl, and C$_{1-3}$ alkoxy; each R$^7$ is independently chosen from C$_{1-6}$ alkyl, tri-C$_{1-6}$-alkylsilyl, C$_{1-6}$ alkoxy, and halo; each R$^8$ is independently a divalent, ethylenically unsaturated organic group; each R$^9$ is independently chosen from H, C$_{1-6}$ alkyl, aralkyl and phenyl; p is an integer from 1 or more; and q is an integer from 0-3. Each R$^6$ is preferably independently chosen from H and C$_{1-3}$ alkyl, and more preferably each $R^6$ is H. It is preferred that each $R^7$ is independently chosen from $C_{1-6}$ alkyl, tri-$C_{1-3}$-alkylsilyl, $C_{1-3}$ alkoxy, and chloro, and more preferably from $C_{1-3}$ alkyl, tri-$C_{1-3}$-alkylsilyl, and $C_{1-3}$ alkoxy. Preferably, each $R^8$ is independently chosen from a $C_{2-6}$ alkenyl, and more preferably each $R^8$ is —CH=CH—. Each $R^9$ is preferably chosen from $C_{1-3}$ alkyl, and more preferably each $R^9$ is methyl. Preferably, p=1-5, more preferably p=1-3, and yet more preferably p=1. It is preferred that q=0. A particularly preferred arylcyclobutene oligomer, 1,3-bis(2-bicyclo[4.2.0]octa-1,3,5-trien-3-ylethenyl)-1,1,3,3-tetramethyldisiloxane (DVS-bisBCB), has the formula

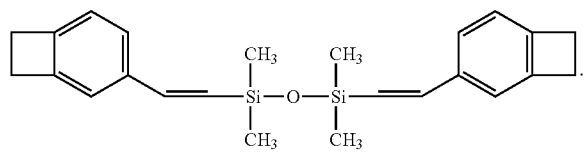 [SMILES: C[Si](C)(C=Cc1ccc2c(c1)CC2)O[Si](C)(C)C=Cc1ccc2c(c1)CC2]

Arylcyclobutene polymers may be prepared by any suitable means, such as those described in U.S. Pat. Nos. 4,812,588; 5,136,069; 5,138,081; and Int. Pat. App. No. WO 94/25903. Suitable arylcyclobutene polymers are also commercially available under the CYCLOTENE™ brand, available from Dow Electronic Materials.

The curable material may be used in the present compositions in an amount from 1 to 99 wt % by solids, preferably from 15 to 75 wt %, and more preferably from 25 to 75 wt %. When a mixture of different arylcyclobutene materials, such as at least two arylcyclobutene monomers or at least two arylcyclobutene polymers or a mixture of arylcyclobutene monomers and arylcyclobutene polymers, is used, any suitable ratio of one arylcyclobutene material to another arylcyclobutene material may be used, such as 1:99 to 99:1.

Toughening agents used in the present compositions comprise —(O—CH$_2$CHR)— as polymerized units, wherein R is a $C_{2-8}$ hydrocarbyl moiety, and are free of —(OCH$_2$CH(CH$_3$))— as polymerized units. Optionally, the present toughening agents may further comprise —(OCH$_2$CH$_2$)— as polymerized units. Preferred toughening agents include those having the formula: $R^1$—(O-A)$_x$(OCH$_2$CH$_2$)$_y$—OR$^2$; wherein $R^1$ and $R^2$ are independently H or a an organic moiety; each A is CH$_2$CHR or CHRCH$_2$; each R is independently a $C_{2-8}$ hydrocarbyl moiety; x is an integer from 2 to 500; and y is an integer from 0 to 500. It is preferred that one of $R^1$ and $R^2$ is H. It is further preferred that one of $R^1$ and $R^2$ is an organic moiety. R is preferably a $C_{2-6}$ hydrocarbyl moiety, more preferably a $C_{2-4}$ hydrocarbyl moiety, and still more preferably a $C_2$ hydrocarbyl moiety. Particularly preferred toughening agents are those of the formula: $R^1$—(O-Bu)$_x$(OCH$_2$CH$_2$)$_y$—OR$^2$; wherein each Bu is CH$_2$CH(C$_2$H$_5$) or CH(C$_2$H$_5$)CH$_2$; and each of $R^1$, $R^2$, x, and y are as defined above. Preferably, the toughening agents have a mole ratio of —(O-A)- to —(OCH$_2$CH$_2$)— of from 20:1 to 2:1, more preferably from 15:1 to 3:1, and yet more preferably from 10:1 to 4:1. It is preferred that x is an integer from 5 to 250, and more preferably from 10 to 150. It is preferred that y is an integer from 0 to 250, more preferably from 0 to 150, yet more preferably from 0 to 100, and even more preferably from 5 to 50. When y>0, the resulting poly(butyleneoxide-ethyleneoxide) copolymer may be random, block or alternating. It is preferred that the toughening agents have a number average molecular weight of from 300 to 50000, more preferably from 500 to 25000, and yet more preferably from 500 to 10000 Da. Preferably, the present toughening agents have a polymer backbone that is free of carbon-carbon double bonds.

The organic moiety of $R^1$ and $R^2$ may be any suitable monovalent organic radical. Suitable monovalent organic radicals include, without limitation, $C_{1-20}$ alkyl, $C_{6-20}$ aryl, $C_{7-40}$ substituted aryl, and dienophiles such as $C_{2-20}$ alkenyl, $C_{2-20}$ alkynyl, maleimide, maleamide/ester, maleamide/carboxylic acid, and (meth)acryloyl, and preferably $C_{1-20}$ alkyl, $C_{2-20}$ alkenyl, $C_{6-20}$ aryl, and $C_{7-40}$ substituted aryl. By "substituted aryl" is meant that one or more hydrogens of an aryl moiety are placed with one or more substituents groups such as $C_{1-20}$ alkyl, $C_{2-20}$ alkenyl, $C_{2-20}$ alkynyl, $C_{1-20}$ alkoxy, and the like. Exemplary monovalent organic radicals include, but are not limited to, methyl, ethyl, propyl, butyl, octyl, decyl, dodecyl, cyclopentyl, cyclohexyl, vinyl, propenyl, butenyl, pentenyl, cyclopentenyl, phenyl, naphthyl, methylphenyl, decylphenyl, dodecylphenyl, vinylphenyl, propenylphenyl, acryloyl, and methacryloyl, preferably butyl, octyl, decyl, dodecyl, vinyl, propenyl, phenyl, decylphenyl, dodecylphenyl, vinylphenyl, and propenylphenyl, and more preferably butyl, octyl, decyl, dodecyl, decylphenyl, dodecylphenyl, vinylphenyl, and propenylphenyl.

The $C_{2-8}$ hydrocarbyl moiety of R may be linear, branched or cyclic, and is preferably linear or branched. Suitable hydrocarbyl moieties include, without limitation, alkyl, alkenyl, alkynyl, alkoxy, and the like, preferably alkyl or alkenyl, and more preferably alkyl. Exemplary hydrocarbyl moieties are: ethyl, n-propyl, iso-propyl, n-butyl, iso-butyl, tert-butyl, n-pentyl, sec-pentyl, iso-pentyl, neo-pentyl, cyclopentyl, n-hexyl, cyclohexyl, n-heptyl, n-octyl, iso-octyl, allyl, butenyl, iso-butenyl, pentenyl, iso-pentenyl, methoxyethyl, ethoxyethyl, methoxypropyl, ethoxypropyl, and ethoxybutyl.

The one or more toughening agents are used in the present compositions in a total amount of 0.1 to 35 wt %, based on the total weight of the curable adhesive material. Preferably, the one or more toughening agents are used in an amount of from 1 to 30 wt %, and more preferably from 2 to 25 wt %.

The present compositions are substantially free of polybutyleneoxide monododecylphenyl ether. "Substantially free of polybutyleneoxide monododecylphenyl ether" means the present compositions contain <1 wt % of polybutyleneoxide monododecylphenyl ether, such as from 0 to <1 wt %, preferably from 0 to 0.5 wt %, and more preferably from 0 to 0.25 wt % of polybutyleneoxide monododecylphenyl ether. It is more preferred that the present compositions are free of polybutyleneoxide monododecylphenyl ether.

Any solvent or mixture of solvents that dissolves or disperses, and preferably dissolves, the curable adhesive material, and the toughening agent, may suitably be used in the present compositions. Exemplary organic solvents include, without limitation: aromatic hydrocarbons such as toluene, xylene, and mesitylene; alcohols such as 2-methyl-1-butanol, 4-methyl-2-pentanol, and methyl isobutyl carbinol; esters such as ethyl lactate, propylene glycol methyl ether acetate, and methyl 2-hydroxyisobutyrate; lactones such as gamma-butyrolactone; lactams such as N-methylpyrrolidinone; ethers such as propylene glycol methyl ether and dipropylene glycol dimethyl ether isomers (commercially available from The Dow Chemical Company as PROGLYDE™ DMM); ketones such as cyclohexanone and methylcyclohexanone; and mixtures thereof.

The present compositions may optionally include one or more additional components, such as curing agents, antioxidants, and the like. Suitable curing agents may aid in the curing of the curable material, and may be activated by heat or light. Exemplary curing agents include, but are not limited to, thermally generated initiators, photoinitiators, azides, nitrenes, and crosslinking agents such as polyamines, polythiols, and (meth)acrylate-containing crosslinkers. The selection of such additional components is well within the ability of those skilled in the art. Each such optional component may be used in the present compositions in an amount of 0 to 25 wt %, and preferably from 0 to 20 wt %, based on the total weight of the composition. More preferably, the present compositions consist essentially of a) a curable material chosen from one or more arylcyclobutene monomers, one or more arylcyclobutene polymers, and mixtures thereof; b) one or more toughening agents comprising as polymerized units —(O—CH$_2$CH(R)—, wherein R is a C$_{2-8}$ hydrocarbyl moiety; c) one or more organic solvents, and optionally d) one or more additives chosen from curing agents, antioxidants, and thickening agents; wherein the one or more toughening agents are free of —(OCH$_2$CH(CH$_3$))— as polymerized units.

The present compositions are prepared by combining the one or more curable materials, the one or more toughening agents, the one or more organic solvents, and any optional additional components in any order. Preferably, the one or more toughening agents are added to a mixture of the one or more curable materials and one or more organic solvents.

The present compositions are useful in forming a layer of an arylcyclobutene polymer having improved toughness on a substrate. Such arylcyclobutene polymer layers are suitable as permanent bonding adhesives, as stress buffer layers, and the like. The present compositions may be coated on a substrate by any suitable method. Suitable methods for disposing the present compositions include, but are not limited to, spin-coating, curtain coating, spray coating, roller coating, dip coating, vapor deposition, and lamination such as vacuum lamination, among other methods. In the semiconductor manufacturing industry, spin-coating is a preferred method to take advantage of existing equipment and processes. In spin-coating, the solids content of the composition may be adjusted, along with the spin speed, to achieve a desired thickness of the composition on the surface it is applied to. Typically, the present compositions are spin-coated at a spin speed of 400 to 4000 rpm. The amount of the present compositions dispensed on the wafer or substrate depends on the total solids content in the composition, the desired thickness of the resulting layer, and other factors well-known to those skilled in the art. When a film or layer of the present compositions is cast, such as by spin-coating, much (or all) of the solvent evaporates during deposition of the film. Preferably, after being disposed on a surface, the composition is heated (baked) to remove any remaining solvent. Typical baking temperatures are from 90 to 160° C., although other temperatures may be suitably used. Such baking to remove residual solvent is typically done for approximately 2 minutes, although longer or shorter times may suitably be used. The arylcyclobutene oligomers are typically cured by heating for a period of time. Suitable curing temperatures range from 180 to 250° C. or higher. Typically curing times range from 1 to 600 minutes.

In an alternate preferred method, the present compositions may be formed as a dry film and is disposed on the surface of a substrate by lamination. A variety of suitable lamination techniques, including vacuum lamination techniques, may be used and are well known to those skilled in the art. In forming a dry film, the present compositions are first disposed onto a front surface of a suitable film support sheet such as a polyester sheet, preferably polyethyleneterephthalate (PET) sheet, or a polyimide sheet such as KAPTON™ polyimide, using slot-die coating, gravure printing, or another appropriate method. The composition is then soft baked at a suitable temperature, such as from 90 to 140° C., for an appropriate time, such as from 1 to 30 minutes, to remove any solvent. A polymer film cover sheet such as polyethylene is then roll-laminated at room temperature onto the dried composition to protect the composition during storage and handling. To dispose the dried composition onto the substrate, the cover sheet is first removed. Then, the dried composition on the support sheet is laminated onto the substrate surface using roll-lamination or vacuum lamination. The lamination temperature can range from 20 to 120° C. The support sheet is then removed (peeled), leaving the dried composition on that surface.

A wide variety of electronic device substrates may be employed in the present invention. An electronic device substrate is any substrate for use in the manufacture of any electronic device. Exemplary electronic device substrates include, without limitation, semiconductor wafers, glass, sapphire, silicate materials, silicon nitride materials, silicon carbide materials, display device substrates, epoxy mold compound wafers, circuit board substrates, and thermally stable polymers. As used herein, the term "semiconductor wafer" is intended to encompass a semiconductor substrate, a semiconductor device, and various packages for various levels of interconnection, including a single-chip wafer, multiple-chip wafer, packages for various levels, substrates for light emitting diodes (LEDs), or other assemblies requiring solder connections. Semiconductor wafers, such as silicon wafers, gallium-arsenide wafers, and silicon-germanium wafers, may be patterned or unpatterned. As used herein, the term "semiconductor substrate" includes any substrate having one or more semiconductor layers or structures which include active or operable portions of semiconductor devices. The term "semiconductor substrate" is defined to mean any construction comprising semiconductive material, such as a semiconductor device. A semiconductor device refers to a semiconductor substrate upon which at least one microelectronic device has been or is being fabricated. Thermally stable polymers include, without limitation, any polymer stable to the temperatures used to cure the arylcyclobutene material, such as polyimide (for example, KAPTON™ polyimide, available from DuPont, Wilmington, Del.).

Optionally, the surface of the substrate to be coated with the present compositions may first be contacted with a suitable adhesion promoter or vapor treated. Such treatments improve the adhesion of the present toughened arylcyclobutene polymers to the substrate surface. Any suitable method, such as spin-coating, dip coating, spray coating, curtain coating, roll coating, vapor deposition, and the like, may be used to contact the substrate surface with the adhesion promoter. Spin-coating is a preferred method for contacting the substrate surface with an adhesion promoter. Any suitable adhesion promoter may be used and the selection of such adhesion promoter is well within the ability of those skilled in the art. Preferred adhesion promoters are silane-containing materials, and more preferably trialkoxysilane-containing materials. Exemplary adhesion promoters include, but are not limited to: bis(trialkoxysilylalkyl)benzenes such as bis(trimethoxysilylethyl)benzene; aminoalkyl trialkoxy silanes such as aminopropyl trimethoxy silane, aminopropyl triethoxy silane, and phenyl aminopropyl triethoxy silane; and other silane coupling agents, as well as mixtures of the foregoing. Particularly suitable adhesion promoters include AP 3000, AP 8000, and AP 9000S, available from Dow Electronic Materials (Marlborough, Mass.). Various vapor treatments known in the art may be used to increase the adhesion of the toughened arylcyclobutene polymers of the present invention to the substrate surface, such as plasma treatments. In certain applications, it may be preferred to use an adhesion promoter to treat the substrate surface prior to coating the surface with the present compositions.

The present compositions are useful for depositing an arylcyclobutene polymer coating having improved toughness as compared to arylcyclobutene polymer coatings that do not use the present toughening agents. Such toughened arylcyclobutene polymer coatings are useful in a variety of applications in the manufacture of electronic devices, such as in permanent bonding applications, buffer layer applications, display applications, and the like.

EXAMPLES

General Procedures

The following general procedures are used in the following examples. The thickness of each cured coating was measured using a Byko-test MP0R film gauge.

Semiconductor Wafer Coating:

Copper-coated silicon wafers were coated on a Laurell WS-650Mz-23NPP system. An amount (2-4 g) of each sample was disposed on a copper-coated silicon wafer using a spin speed of 1000 to 2500 rpm for up to 45 seconds, followed by soft bake at 100° C. for 90 seconds on a hot plate, followed by cooling. The coating was then cured by heating in an oven for 1 h at 250° C. in a nitrogen atmosphere. The final coating thickness ranged from 5 to 20 μm.

Fracture Toughness:

The fracture toughness of each cured sample was determined following the general procedure of B. M. Kleman et al., *The Fracture Toughness of Thin Polymeric Films, Polymer Engineering and Science*, mid-January 1996, vol. 36, no. 1, pp 126-134. Each cured coating was cut by a laser cutter into a grid of 2.5×1 cm rectangles, followed by immersion in an aqueous copper-etching solution of 5-10% ammonium persulfate until the rectangular strips were fully delaminated from the copper substrate. The free-standing film strips were washed with deionized (DI) water and air dried. Each strip was then glued to a paper frame for temporary support during pre-crack insertion and loading into the grips of the mechanical test frame. A pre-crack (approximately ¼ or less of the width) in the film was made using a sharp scalpel. The length of the pre-crack was measured using an optical microscope equipped with a scale. Fracture testing was conducted on a Texture Analyzer (TA.XT.Plus) equipped with a 5 kg load cell, by first loading a supported specimen into the grips, then cutting the side pieces of the paper support, then tensilely deforming the specimen at a cross-head displacement rate of 0.01 mm/min at 21° C. and 50% relative humidity, recording the peak load corresponding to propogation of the pre-crack. Fracture toughness ($K_{1c}$) was calculated from crack length at fracture instability ($a_0$), stress at fracture instability ($\sigma_f$), and geometric correction factor (f(a/W) where W is film width, according to the following equation:

$$K_{1c} = f(a/W)\sigma_f a_0^{0.5}$$

Fracture energy ($G_{1c}$) was calculated from $K_{1c}$ and modulus (E) according to the equation: $G_{1c} = K_{1c}^2/E$, where the modulus of the material was measured by nanoindentation using a Fisherscope HM2000 XYp indenter equipped with a Berkovich tip.

Example 1

Each of the samples reported in Table 1 was prepared by combining a weighed amount of toughening agent (TA) to a DVS-bisBCB oligomer solution ($M_w$~211 kDa, 51.5 wt % solids in PROGLYDE™ DMM), followed by mixing the sample at elevated temperature until complete dissolution of the toughening agent was achieved (typically 60° C. for 10 min). Each toughening agent is reported using the average number of (O-Bu) and (O—CH$_2$CH$_2$) moieties; where Bu is CH$_2$CH(C$_2$H$_5$) or CH(C$_2$H$_5$)CH$_2$. In Comparative Sample C1, a toughening agent having —(O-Bu)- and —(OCH$_2$CH(CH$_3$))— as polymerized units was used.

TABLE 1

| Sample No. | DVS-bisBCB wt % (solids) | TA | TA wt % (solids) |
|---|---|---|---|
| Control | 100 | None | 0 |
| 1 | 91 | C$_4$H$_9$(O—Bu)$_9$—OH | 9 |
| 2 | 95 | Dodecylphenyl-(O—Bu)$_{21}$—OH | 5 |
| 3 | 90 | Dodecylphenyl-(O—Bu)$_{21}$—OH | 10 |
| 4 | 91 | H(O—Bu)$_{39}$—OH | 9 |
| 5 | 95 | Propenylphenyl-(O—Bu)$_{44}$(OCH$_2$CH$_2$)$_6$—OH | 5 |
| 6 | 90 | Propenylphenyl-(O—Bu)$_{44}$(OCH$_2$CH$_2$)$_6$—OH | 10 |
| 7 | 95 | Propenylphenyl-(O—Bu)$_{44}$(OCH$_2$CH$_2$)$_{11}$—OH | 5 |
| 8 | 90 | Propenylphenyl-(O—Bu)$_{44}$(OCH$_2$CH$_2$)$_{11}$—OH | 10 |
| C1 | 91 | Dodecyl-(O—Bu)$_{31}$(OCH$_2$CH(CH$_3$))$_6$—OH | 9 |

Each formulation was spin-coated on a copper-coated silicon wafer as described in the General Procedures. Each of the samples was visually transparent after both soft baking and curing steps. The thickness of each cured sample was determined after the coating was subjected to fracture toughness analysis. Each cured sample was evaluated to determine its fracture toughness according to the procedure described in the General Procedures. The results are reported in Table 2. The reported fracture toughness is an average of at least 5 measurements per sample.

TABLE 2

| Sample No. | Film Thickness (μm) | Fracture Toughness $K_{1c}$ (MPa/m$^2$) | Modulus (GPa) | G1c (J/m$^2$) |
|---|---|---|---|---|
| Control | 14.7-16 | 0.45 | 3.2 | 62 |
| 1 | 6.4 | 0.72 | 2.7 | 189 |
| 2 | 6.6 | 0.74 | 2.7 | 207 |
| 3 | 6.9-7.4 | 0.86 | 2.3 | 320 |
| 4 | 7.4-11.7 | 0.56 | 2.7 | 119 |
| 5 | 5.8 | 0.82 | 2.8 | 239 |
| 6 | 7.9 | 0.58 | 2.7 | 126 |
| 7 | 5.6 | 1.13 | 2.9 | 444 |
| 8 | 5.5 | 1.17 | 2.1 | 650 |
| C1 | 10.9 | 0.45 | 2.7 | 73 |

As can be seen from the above data, the toughening agents of the invention provide cured arylcyclobutene coatings having improved toughness as compared to cured arylcyclobutene coatings without such toughening agent (Control). Comparative Sample C1 showed no difference in fracture toughness as compared to the Control, indicating that materials having —(O-Bu)- and —(OCH$_2$CH(CH$_3$))— as polymerized units do not improve the fracture toughness of arylcyclobutene polymers.

Example 2

The procedure of Example 1 is repeated except that the toughening agents and amounts listed in Table 3 are used. In Table 3, the following abbreviations are used: —(O-Hex)- represents —(OCH$_2$CH(C$_4$H$_9$))— or —(OCH(C$_4$H$_9$)CH$_2$)— or a combination of these, and —(O-Oct)- represents —(OCH$_2$CH(C$_6$H$_{13}$))— or —(OCH(C$_6$H$_{13}$)CH$_2$)— or a combination of these.

TABLE 3

| Sample No. | DVS-bisBCB wt % (solids) | TA | TA wt % (solids) |
|---|---|---|---|
| 9 | 97 | Propenylphenyl-(O—Bu)$_{44}$(OCH$_2$CH$_2$)$_{11}$—OH | 3 |
| 10 | 88 | Propenylphenyl-(O—Bu)$_{44}$(OCH$_2$CH$_2$)$_6$—OH | 12 |
| 11 | 95 | Dodecyl-(O—Bu)$_{25}$—OH | 5 |
| 12 | 92 | Octyl-(O—Bu)$_{21}$—OH | 8 |
| 13 | 90 | Octyl-(O—Bu)$_{37}$—OH | 10 |
| 14 | 95 | Dodecylphenyl-(O—Bu)$_{44}$(OCH$_2$CH$_2$)$_6$—OH | 5 |
| 15 | 90 | Styryl-(O—Bu)$_{35}$(OCH$_2$CH$_2$)$_9$—OH | 10 |
| 16 | 95 | Dodecylphenyl-(O—Bu)$_{44}$(OCH$_2$CH$_2$)$_{18}$—OH | 5 |
| 17 | 85 | Propenylphenyl-(O—Bu)$_{35}$(OCH$_2$CH$_2$)$_{11}$—OH | 15 |
| 18 | 93 | Phenyl-(O—Bu)$_{21}$—OH | 7 |
| 19 | 85 | Dodecylphenyl-(O—Bu)$_{21}$—OH | 15 |
| 20 | 92 | Propenylphenyl-(O-Hex)$_{35}$—OH | 8 |
| 21 | 89 | Propenylphenyl-(O-Hex)$_{42}$—OH | 11 |
| 22 | 86 | Dodecyl-(O-Oct)$_{35}$—OH | 14 |
| 23 | 90 | Phenyl-(O-Hex)$_{28}$(OCH$_2$CH$_2$)$_{11}$—OH | 10 |
| 24 | 90 | Octyl-(O-Hex)$_{37}$(OCH$_2$CH$_2$)$_9$—OH | 10 |
| 25 | 88 | H—(O-Hex)$_{30}$—OH | 12 |
| 26 | 93 | Propenylphenyl-(O-Oct)$_{30}$(OCH$_2$CH$_2$)$_{20}$—OH | 7 |

Example 3

The procedure of Example 1 was repeated except that the toughening agents and amounts listed in Table 4 were used and the substrate was glass. Cured films were visually evaluated to determine whether phase separation had occurred. These results are reported in Table 4, where O=no phase separation visually observed and X=phase separation visually observed.

TABLE 4

| Sample No. | DVS-bisBCB wt % (solids) | TA | TA wt % (solids) | Phase Separation |
|---|---|---|---|---|
| 27 | 83 | C$_4$H$_9$(O—Bu)$_9$—OH | 17 | O |
| 28 | 68 | C$_4$H$_9$(O—Bu)$_9$—OH | 32 | O |
| 29 | 83 | C$_4$H$_9$(O—Bu)$_{13}$—OH | 17 | O |
| 30 | 68 | C$_4$H$_9$(O—Bu)$_{13}$—OH | 32 | O |
| 31 | 83 | C$_4$H$_9$(O—Bu)$_{20}$—OH | 17 | O |
| 32 | 68 | C$_4$H$_9$(O—Bu)$_{20}$—OH | 32 | O |
| 33 | 83 | Dodecylphenyl-(O—Bu)$_{21}$—OH | 17 | O |
| 34 | 68 | Dodecylphenyl-(O—Bu)$_{21}$—OH | 32 | X |
| 35 | 83 | H(O—Bu)$_{39}$—OH | 17 | X |
| 36 | 91 | H(O—Bu)$_{39}$—OH | 9 | O |
| 37 | 91 | H(O—Bu)$_{66}$—OH | 9 | X |

What is claimed is:

1. A composition comprising: a) a curable material chosen from one or more arylcyclobutene monomers, one or more polymers comprising one or more arylcyclobutene monomers as polymerized units, and mixtures thereof; b) one or more toughening agents comprising as polymerized units —(O—CH$_2$CHR)—, wherein R is a C$_{2-8}$ hydrocarbyl moiety; and c) one or more organic solvents; wherein the one or more toughening agents are free of —(OCH$_2$CH(CH$_3$))— as polymerized units, and wherein the compositions are substantially free of release additives.

2. The composition of claim 1 wherein the one or more toughening agents further comprise —(OCH$_2$CH$_2$)— as polymerized units.

3. The composition of claim 2 wherein the one or more toughening agents have the formula: R$^1$—(O-A)$_x$(OCH$_2$CH$_2$)$_y$—OR$^2$; wherein A is CH$_2$CHR or CHRCH$_2$; R is a C$_{2-8}$ hydrocarbyl moiety; R$^1$ and R$^2$ are independently chosen from H, C$_{1-20}$ alkyl, aryl and substituted aryl; x is an integer from 2 to 500; and y is an integer from 0 to 500; wherein at least one of R$^1$ and R$^2$ is H.

4. The composition of claim 3 wherein one of R$^1$ and R$^2$ is H.

5. The composition of claim 1 wherein the one or more toughening agents are present in an amount of 0.1 to 35 wt %, based on the total weight of the one or more curable polymers.

6. The composition of claim 1 wherein R is a C$_{2-6}$ hydrocarbyl moiety.

7. The composition of claim 1 wherein the one or more arylcyclobutene monomers have the formula:

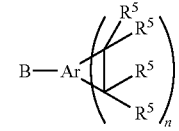

wherein B is an n-valent linking group; Ar is a polyvalent aryl group and the carbon atoms of the cyclobutene ring are bonded to adjacent carbon atoms on the same aromatic ring of Ar; n is an integer of 1 or more; and R$^5$ is a monovalent group.

8. The composition of claim 6 wherein the one or more arylcyclobutene monomers have the formula:

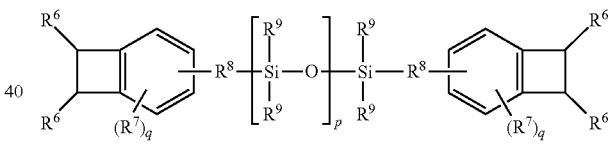

wherein each R$^6$ is independently chosen from H, C$_{1-6}$ alkyl, and C$_{1-6}$ alkoxy; each R$^7$ is independently chosen from C$_{1-6}$ alkyl, tri-C$_{1-6}$-alkylsilyl, C$_{1-6}$ alkoxy, and halo; each R$^8$ is independently a divalent, ethylenically unsaturated organic group; each R$^9$ is independently chosen from H, C$_{1-6}$ alkyl, aralkyl and phenyl; p is an integer of 1 or more; and q is an integer from 0-3.

9. The composition of claim 1 wherein the composition is substantially free of polybutyleneoxide monododecylphenyl ether.

10. A method comprising: coating on a substrate a layer of a composition comprising: one or more curable polymers comprising one or more arylcyclobutene monomers as polymerized units; one or more toughening agents comprising as polymerized units —(O—CH$_2$CHR), wherein R is a C$_{2-8}$ hydrocarbyl moiety-; and one or more organic solvents; wherein the one or more toughening agents are free of —(OCH$_2$CH(CH$_3$))— as polymerized units; at least partially removing the one or more organic solvents; and curing the one or more curable polymers to form a cured polymer coating.

11. The method of claim 10 wherein the composition is substantially free of polybutyleneoxide monododecylphenyl ether.

12. A polymer coating comprising: a) a polymer comprising one or more arylcyclobutene monomers as polymerized units; and b) one or more toughening agents comprising as polymerized units —(O—CH$_2$CHR)—, wherein R is a C$_{2-8}$ hydrocarbyl moiety; wherein the one or more toughening agents are free of —(OCH$_2$CH(CH$_3$))— as polymerized units, and wherein the polymer coating is substantially free of release additives.

13. The polymer coating of claim 12 wherein the polymer coating is substantially free of polybutyleneoxide monododecylphenyl ether.

* * * * *